(12) United States Patent
Xie et al.

(10) Patent No.: US 11,189,713 B2
(45) Date of Patent: Nov. 30, 2021

(54) NANOSHEET TRANSISTOR HAVING WRAP-AROUND BOTTOM ISOLATION

(71) Applicant: International Business Machines Corporation, Armonk, NY (US)

(72) Inventors: Ruilong Xie, Niskayuna, NY (US); Lan Yu, Voorheesville, NY (US); Heng Wu, Guilderland, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 9 days.

(21) Appl. No.: 16/748,865

(22) Filed: Jan. 22, 2020

(65) Prior Publication Data

US 2021/0226034 A1 Jul. 22, 2021

(51) Int. Cl.
*H01L 29/66* (2006.01)
*H01L 29/51* (2006.01)
*H01L 29/06* (2006.01)

(52) U.S. Cl.
CPC ........ *H01L 29/6681* (2013.01); *H01L 29/068* (2013.01); *H01L 29/0649* (2013.01); *H01L 29/51* (2013.01); *H01L 29/66818* (2013.01)

(58) Field of Classification Search
CPC ............. H01L 29/6681; H01L 29/0649; H01L 29/068; H01L 29/51; H01L 29/66818
See application file for complete search history.

(56) References Cited

U.S. PATENT DOCUMENTS

| 9,620,590 | B1 | 4/2017 | Bergendahl et al. |
| 9,741,792 | B2 | 8/2017 | Cheng et al. |
| 9,871,099 | B2 | 1/2018 | Pranatharthiharan et al. |
| 9,881,998 | B1 | 1/2018 | Cheng et al. |
| 9,947,804 | B1 | 4/2018 | Frougier et al. |
| 9,984,936 | B1* | 5/2018 | Xie ........................ B82Y 10/00 |
| 10,032,867 | B1 | 7/2018 | Yeung et al. |
| 10,170,638 | B1 | 1/2019 | Reznicek |
| 10,256,158 | B1 | 4/2019 | Frougier et al. |
| 10,818,803 | B1* | 10/2020 | Frougier ........... H01L 29/78696 |
| 2018/0261670 | A1* | 9/2018 | Yeung ................. H01L 29/0673 |
| 2018/0308986 | A1 | 10/2018 | Chao et al. |
| 2019/0341448 | A1* | 11/2019 | Bourjot ............... H01L 29/0653 |

OTHER PUBLICATIONS

Loubet et al., "Stacked Nanosheet Gate-All-Around Transistor to Enable Scaling Beyond FinFET", 2017 Symposium on VLSI Technology Digest of Technical Papers, pp. T230-T231.

* cited by examiner

*Primary Examiner* — Christine A Enad
(74) *Attorney, Agent, or Firm* — Cantor Colburn LLP; Randall Bluestone

(57) ABSTRACT

Embodiments of the invention are directed to a method of performing fabrication operations to form a nanosheet field effect transistor (FET) device. The fabrication operations include forming a sacrificial structure over a substrate, wherein the sacrificial structure includes a central region, a first leg at a first end of the central region, and a second leg at a second end of the central region. A nanosheet stack is formed over the central region. An isolation material is deposited within a space that was occupied by the sacrificial structure to form a wrap-around bottom dielectric isolation (BDI) structure having a BDI central region, a first BDI leg at a first end of the BDI central region, and a second BDI leg at a second end of the BDI central region.

13 Claims, 14 Drawing Sheets

US 11,189,713 B2

NANOSHEET TRANSISTOR HAVING WRAP-AROUND BOTTOM ISOLATION

BACKGROUND

The present invention relates in general to fabrication methods and resulting structures for semiconductor devices. More specifically, the present invention relates to fabrication methods and resulting structures for nanosheet transistors having a wrap-around bottom isolation structure configured to provide improved electrical isolation between the substrate and both the source/drain (S/D) regions and the gate.

In contemporary semiconductor device fabrication processes, a large number of semiconductor devices, such as n-type field effect transistors (nFETs) and p-type field effect transistors (pFETs), are fabricated on a single wafer. Nonplanar transistor device architectures (e.g., fin-type FETs (FinFETs) and nanosheet FETs) can provide increased device density and increased performance over planar transistors. For example, nanosheet transistors, in contrast to conventional planar FETs, include a gate stack that wraps around the full perimeter of multiple stacked nanosheet channel regions for a reduced device footprint and improved control of channel current flow. Nanosheet transistors also enable full depletion in the nanosheet channel regions and reduce short-channel effects.

To reduce unwanted leakage and parasitic capacitance, it is necessary to provide nanosheet FETs with dielectric isolation between active channel regions of the nanosheet FET and the underlying substrate.

SUMMARY

Embodiments of the invention are directed to a method of performing fabrication operations to form a nanosheet field effect transistor (FET) device. The fabrication operations include forming a sacrificial structure over a substrate, wherein the sacrificial structure includes a central region, a first leg at a first end of the central region, and a second leg at a second end of the central region. A nanosheet stack is formed over the central region. The sacrificial structure is removed, and an isolation material is deposited in a space that was occupied by the sacrificial structure to form a wrap-around bottom dielectric isolation (BDI) structure having a BDI central region, a first BDI leg at a first end of the BDI central region, and a second BDI leg at a second end of the BDI central region.

Embodiments of the invention are directed to a method of performing fabrication operations to form a nanosheet FET device. The fabrication operations include forming a sub-fin of a substrate. A sacrificial structure is formed over the sub-fin of a substrate, wherein the sacrificial structure includes a central region, a first leg at a first end of the central region, and a second leg at a second end of the central region. A nanosheet stack is formed over the central region. A first portion of the first leg is on a first sidewall of the nanosheet stack, and a second portion of the first leg is on a first sidewall of the sub-fin. A first portion of the second leg is on a second sidewall of the nanosheet stack, and a second portion of the second leg is on a second sidewall of the sub-fin. A dielectric layer is deposited over the substrate and adjacent the first leg and the second leg. The dielectric layer is recessed to form STI regions and expose the first portion of the first leg and the second portion of the second leg. The first portion of the first leg and the second portion of the second leg are removed. The sacrificial structure is removed, and an isolation material is deposited within a space that was occupied by the sacrificial structure to form a wrap-around BDI structure having a BDI central region, a first BDI leg at a first end of the BDI central region, and a second BDI leg at a second end of the BDI central region.

Embodiments of the invention are directed to a nano sheet FET device that includes a nanosheet stack and a wrap-around BDI structure positioned under the nanosheet stack, over a top surface of a portion of a substrate, and on sidewalls of the portion of the substrate.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-14 depict multiple cross-sectional views of a nanosheet-based structure after various fabrication operations for forming a nanosheet FETs having a wrap-around bottom isolation region in accordance with aspects of the invention, in which:

FIG. 1 depicts cross-sectional views of the nanosheet-based structure after initial fabrication operations in accordance with aspects of the present invention;

FIG. 2 depicts cross-sectional views of the nanosheet-based structure after additional fabrication operations in accordance with aspects of the present invention;

FIG. 3 depicts cross-sectional views of the nanosheet-based structure after additional fabrication operations in accordance with aspects of the present invention;

FIG. 4 depicts cross-sectional views of the nanosheet-based structure after additional fabrication operations in accordance with aspects of the present invention;

FIG. 5 depicts cross-sectional views of the nanosheet-based structure after additional fabrication operations in accordance with aspects of the present invention;

FIG. 6 depicts cross-sectional views of the nanosheet-based structure after additional fabrication operations in accordance with aspects of the present invention;

FIG. 7 depicts cross-sectional views of the nanosheet-based structure after additional fabrication operations in accordance with aspects of the present invention;

FIG. 8 depicts cross-sectional views of the nanosheet-based structure after additional fabrication operations in accordance with aspects of the present invention;

FIG. 9 depicts cross-sectional views of the nanosheet-based structure after additional fabrication operations in accordance with aspects of the present invention;

FIG. 10 depicts cross-sectional views of the nanosheet-based structure after additional fabrication operations in accordance with aspects of the present invention;

FIG. 11 depicts cross-sectional views of the nanosheet-based structure after additional fabrication operations in accordance with aspects of the present invention;

FIG. 12 depicts cross-sectional views of the nanosheet-based structure after additional fabrication operations in accordance with aspects of the present invention;

FIG. 13 depicts cross-sectional views of the nanosheet-based structure after additional fabrication operations in accordance with aspects of the present invention; and FIG. 14 depicts cross-sectional views of the nanosheet-based structure after additional fabrication operations in accordance with aspects of the present invention.

DETAILED DESCRIPTION

Figure 1:
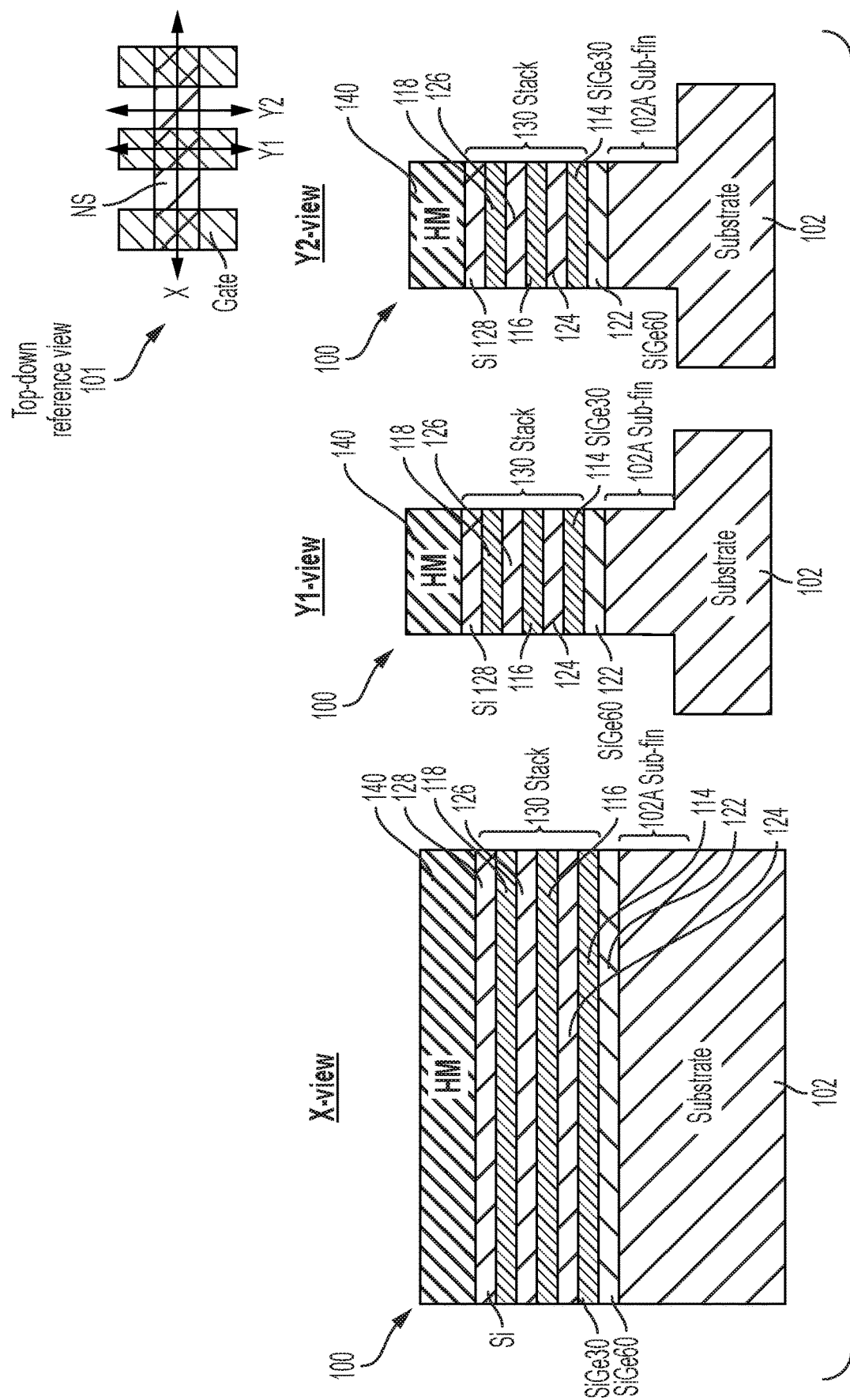

Although this detailed description includes examples of how aspects of the invention can be implemented to form a wrap-around bottom isolation region in an exemplary gate-all-around (GAA) nanosheet FET architecture having silicon (Si) channel nanosheets and SiGe sacrificial nanosheets, implementation of the teachings recited herein are not limited to a particular type of FET structure or combination of materials. Rather, embodiments of the present invention are capable of being implemented in conjunction with any other type of transistor device or material, now known or later developed, wherein it is desirable to provide improved electrical isolation of the S/D regions and the gate from the underlying substrate.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet FETs that provide the performance characteristics required for a particular application. For example, to reduce the leakage and parasitic capacitance, it is necessary to provide nanosheet FETs with a so-called "bottom" dielectric isolation (BDI) region between active regions of the nanosheet FET and the underlying substrate. Theoretically, BDI would be provided by forming a dielectric layer (e.g., $SiO_2$) over the substrate then forming the initial stack of alternating channel nanosheets and sacrificial nanosheets over the dielectric layer. However, this approach is not practical because the semiconductor materials (e.g., Si, SiGe) from which the stack of alternating channel and sacrificial nanosheets are formed cannot be epitaxially grown at high quality levels (e.g., as single crystal material) from the dielectric layer. Accordingly, alternative methods of forming BDI have been developed.

A shortcoming of known BDI fabrication processes is that inevitable fabrication process variations can result in the shallow trench isolation (STI) regions of the FET being unintentionally recessed so that the STI region is lower than the BDI region. Unintended STI recess can expose portions of the sub-fin, which is the fin-shaped portion of the substrate positioned under the spaced-apart channel nanosheets and the gate. During formation of the high-k metal gate (HKMG) stack, exposed portions of the sub-fin will be covered by the high-k dielectric material. The presence of a high-k dielectric on the sub-fin introduces unwanted parasitic capacitance, which negatively impacts AC (alternating current) performance of the FET.

Turning now to an overview of aspects of the invention, embodiments of the invention provide fabrication methods and resulting structures for nano sheet FETs having a wrap-around BDI structure configured to provide improved electrical isolation between the underlying substrate and both the S/D region(s) and the HKMG stack of the nanosheet FET. The wrap-around BDI structure in embodiments of the invention can be any overall shape that includes a first region that isolates the gate region and the nanosheet channels from the underlying substrate; a second region that isolates a first STI region from a portion of the substrate; and a third region that isolates a second STI region from a portion of the substrate. In some embodiments of the invention, the wrap-around BDI structure can be configured to include at least an inverted U-shape that includes but is not limited to a laterally elongated BDI central region and high aspect-ratio BDI "legs" that extend vertically from each end of the BDI central region. In embodiments of the invention, the wrap-around BDI structure wraps around the sub-fin portion of the substrate below the spaced-apart nanosheet channels. The BDI central region touches the HKMG stack, the left and right BDI legs separate the STI from the sub-fin portion of the substrate, and at least a part of the HKMG stack that is outside the nanosheet channels lands above the BDI legs. Regardless of the specific layout of the wrap-around BDI region formed in accordance with aspects of the invention, the wrap-around BDI structure ensures that, regardless of the level of unintended STI height variations, the HKMG stack does not contact the substrate, thereby minimizing parasitic capacitance and substantially eliminating the impact of the STI's height level on parasitic capacitance. In embodiments of the invention, the height of the BDI legs can extend to the bottom of the STI region, which greatly enlarges the process window for the STI regions and better accommodates the unintentional but inevitable STI recess that occurs during the downstream device processing operations.

Figure 9:
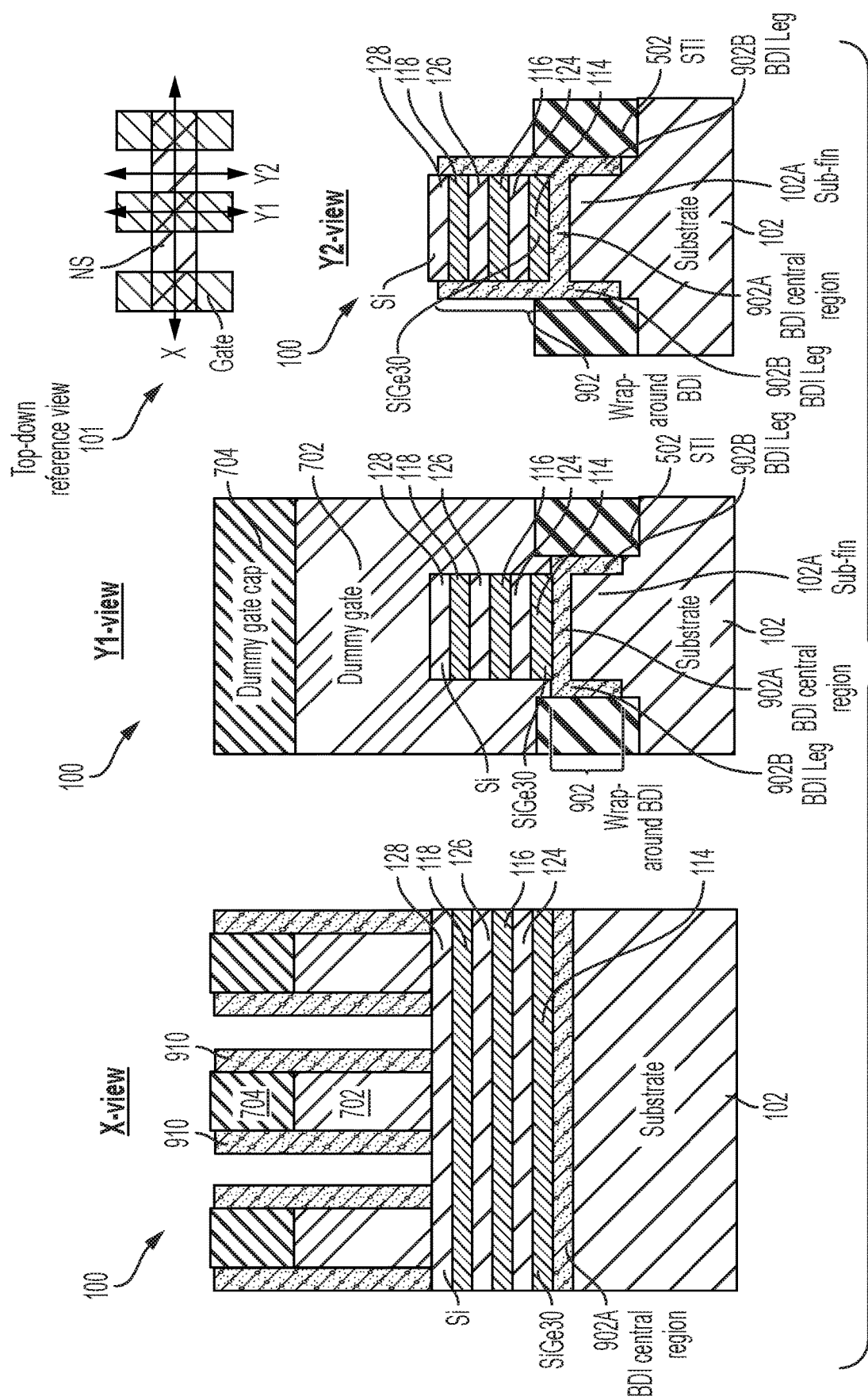
Figure 10:
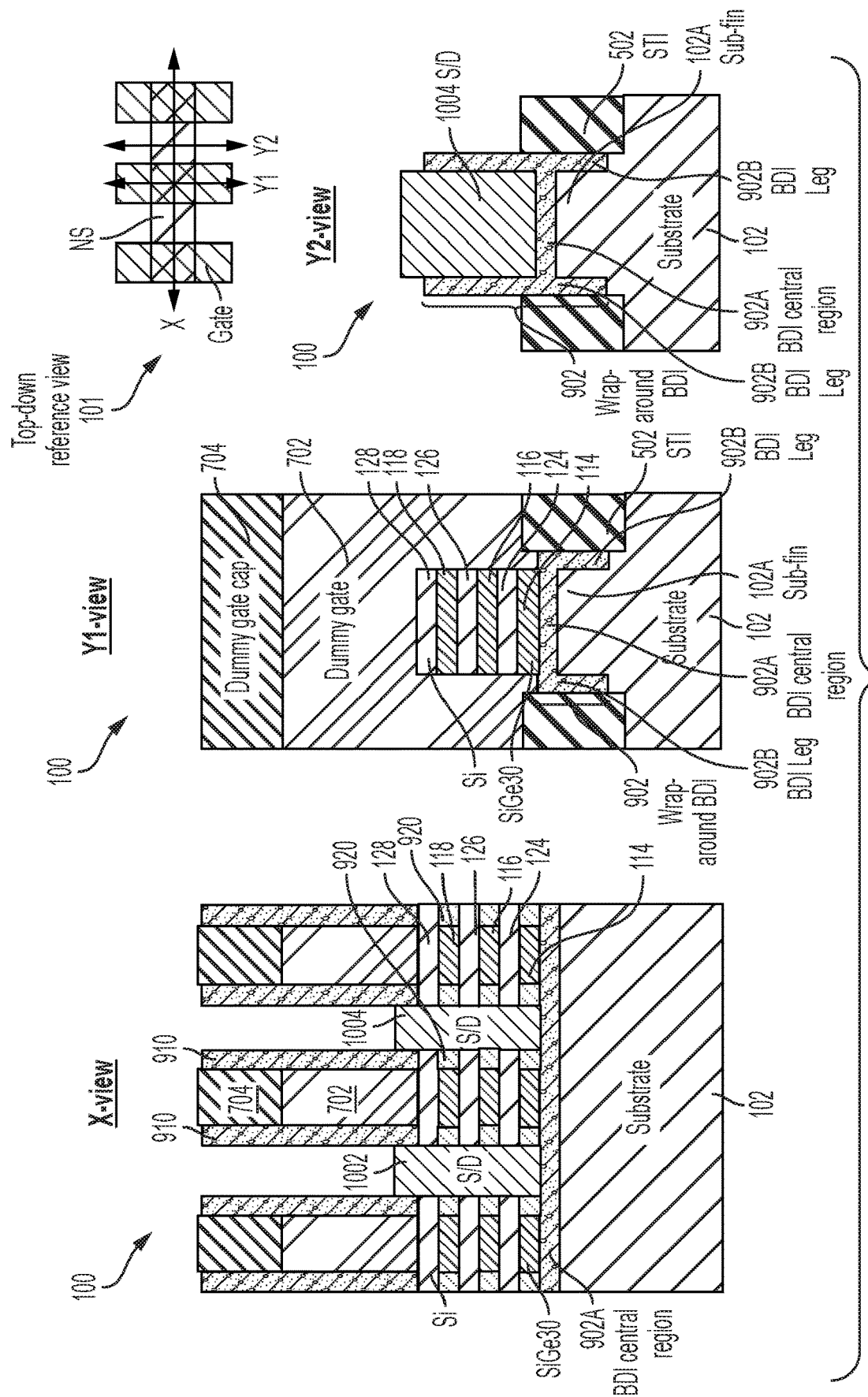

Turning now to a more detailed description of fabrication operations and resulting structures according to aspects of the invention, FIGS. 1-14 depict a nanosheet-based structure 100 after various fabrication operations for forming nanosheet FETs having a bottom isolation layer 1002 (shown in FIG. 10). For ease of illustration, the fabrication operations depicted in FIGS. 1-11 will be described in the context of forming a single nanosheet stack 130 (shown in FIG. 1). However, it is intended that fabrication operations described herein apply equally to the fabrication of any number of nanosheet stacks.

Although the cross-sectional diagrams depicted in FIGS. 1-14 are two-dimensional, it is understood that the diagrams depicted in FIGS. 1-14 represent three-structures. The top-down reference diagram 101 shown in FIG. 1 provides a reference point for the various cross-sectional views (X-view, Y1-view, and Y2-view) shown in FIGS. 1-14. The X-view is a side view taken across the three gates, the Y1-view is an end view taken through the active gate, and the Y2-view is an end view taken through a portion of the nanosheet (NS) stack where one of the S/D regions is (or will be) formed.

FIG. 1 depicts cross-sectional views of the nanosheet-based structure 100 after initial fabrication operations in accordance with aspects of the present invention. As shown in FIG. 1, a BDI sacrificial nanosheet 122 is formed over a substrate 102, and a nanosheet stack 130 is formed over the BDI sacrificial nanosheet 122. The nanosheet stack 130 includes an alternating series of SiGe sacrificial nanosheet layers 114, 116, 118 and Si nanosheet layers 124, 126, 128. In accordance with aspects of the invention, the BDI sacrificial nanosheet 122 is epitaxially grown from the substrate 102, and the nanosheet stack 130 is epitaxially grown from the BDI sacrificial nanosheet 122. The alternating layers 114, 124, 116, 126, 118, 128 of the nanosheet stack 130 are formed by epitaxially growing one layer and then the next until the desired number and desired thicknesses of the nanosheet layers are achieved. Although six alternating layers 114, 124, 116, 126, 118, 128 are depicted in the figures, any number of alternating layers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the invention, the BDI sacrificial nanosheet 122 is SiGe having a Ge percentage that is sufficiently different from the Ge percentage in the SiGe sacrificial nanosheet layers 114, 116, 118 that the BDI sacrificial layer 122 can be selectively removed without also removing the SiGe sacrificial nanosheet layers 114, 116, 118. In some embodiments of the invention, the BDI sacrificial nanosheet layer 122 can be SiGe 60%, and the SiGe sacrificial nanosheet layers 114, 116, 118 can be SiGe 30%. The notation "SiGe 60%" is used to indicate that 60% of the SiGe material is Ge and 40% of the SiGe material is Si. In some embodiments of the invention, the Ge percentage in the SiGe BDI sacrificial nanosheet 122 can range from about 50% to about 70%. In some embodiments of the invention, the Ge percentage in the SiGe sacrificial nanosheet layers 114, 116, 118 can range from about 20% to about 45% as long as the necessary etch selectivity between the BDI sacrificial nanosheet layer 122 and the SiGe sacrificial nanosheet layers 114, 116, 118 is established.

As shown in FIG. 1, a hard mask (HM) layer 140 has been deposited over the over the nanosheet stack 130 then patterned and etched to define the nanosheet stack 130 and the sub-fin 102A. Any suitable deposition process (e.g., CVD or PVD) can be used to deposit the hard mask 140. The hard mask 140 can be any suitable dielectric, including but not limited to SiN.

Figure 2:
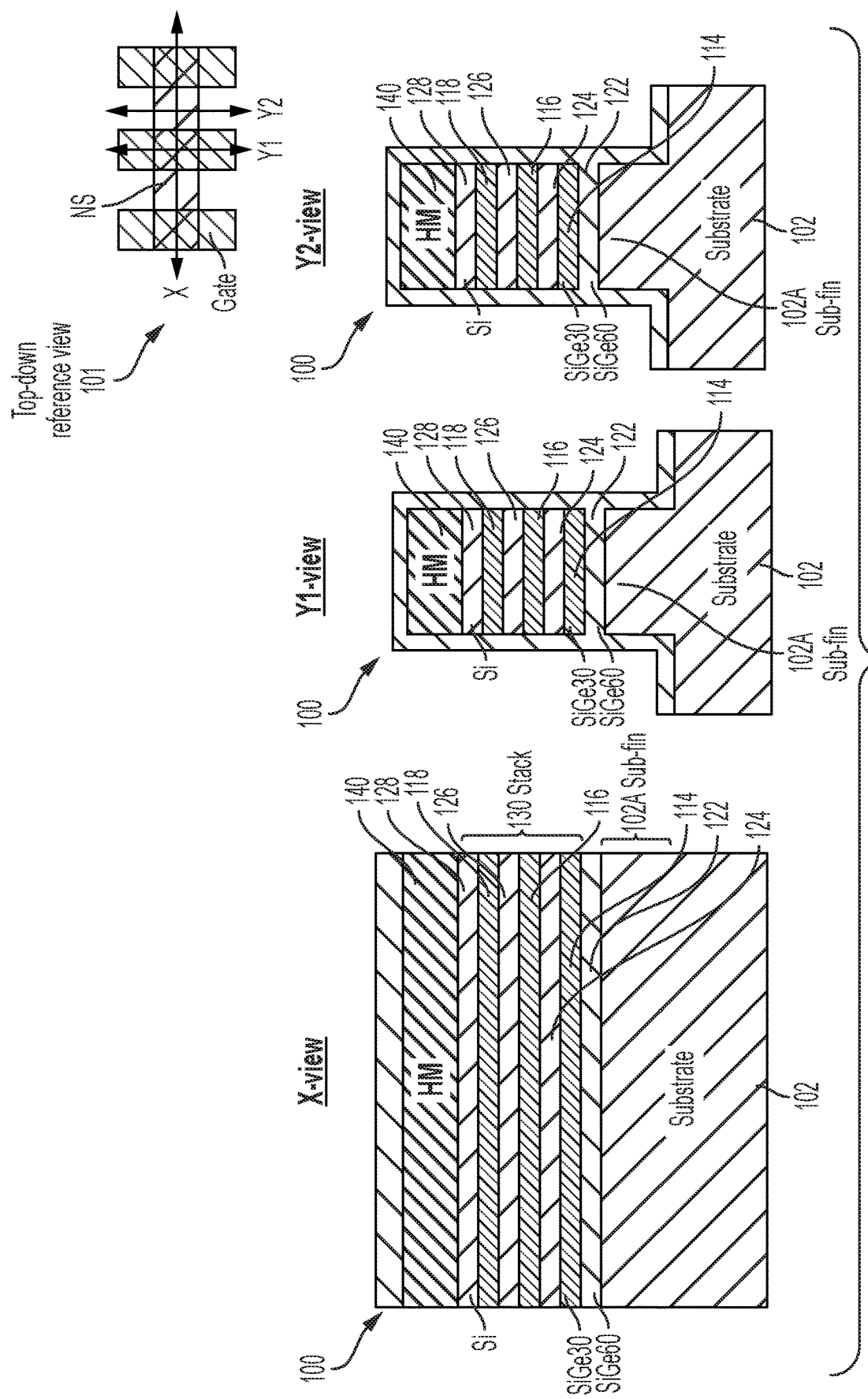

In FIG. 2, known fabrication operations have been used to deposit an additional sacrificial material over the structure 100, thereby expanding the BDI sacrificial nanosheet 122 into a BDI sacrificial region 122 having the footprint and volume shown in FIG. 2. In accordance with aspects of the invention, the additional sacrificial material can be SiGe 60%. In some embodiment of the invention, the additional sacrificial material is a material other than SiGe 60% (e.g., $TiO_X$) having the ability to be selectively removed through wet/dry etching. In embodiments of the invention, the additional deposited sacrificial material can be poly crystalline or amorphous material.

Figure 3:
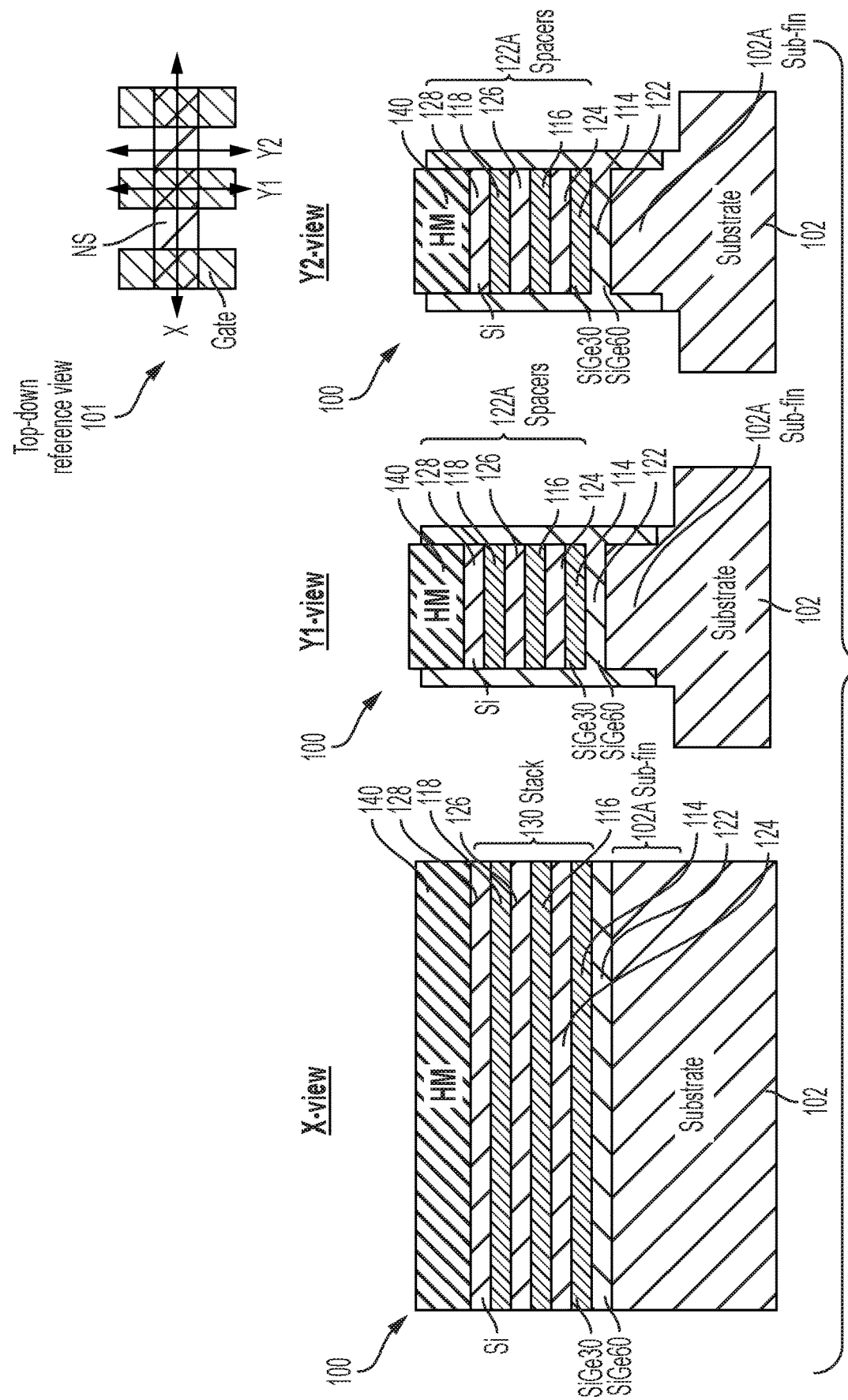

In FIG. 3, known fabrication operations (e.g., anisotropic RIE processes) have been used to directionally recess the BDI sacrificial region 122 so that it has the footprint and H-shaped volume shown in FIG. 2. The H-shaped BDI sacrificial region 122 now includes spacers 122A.

Figure 4:
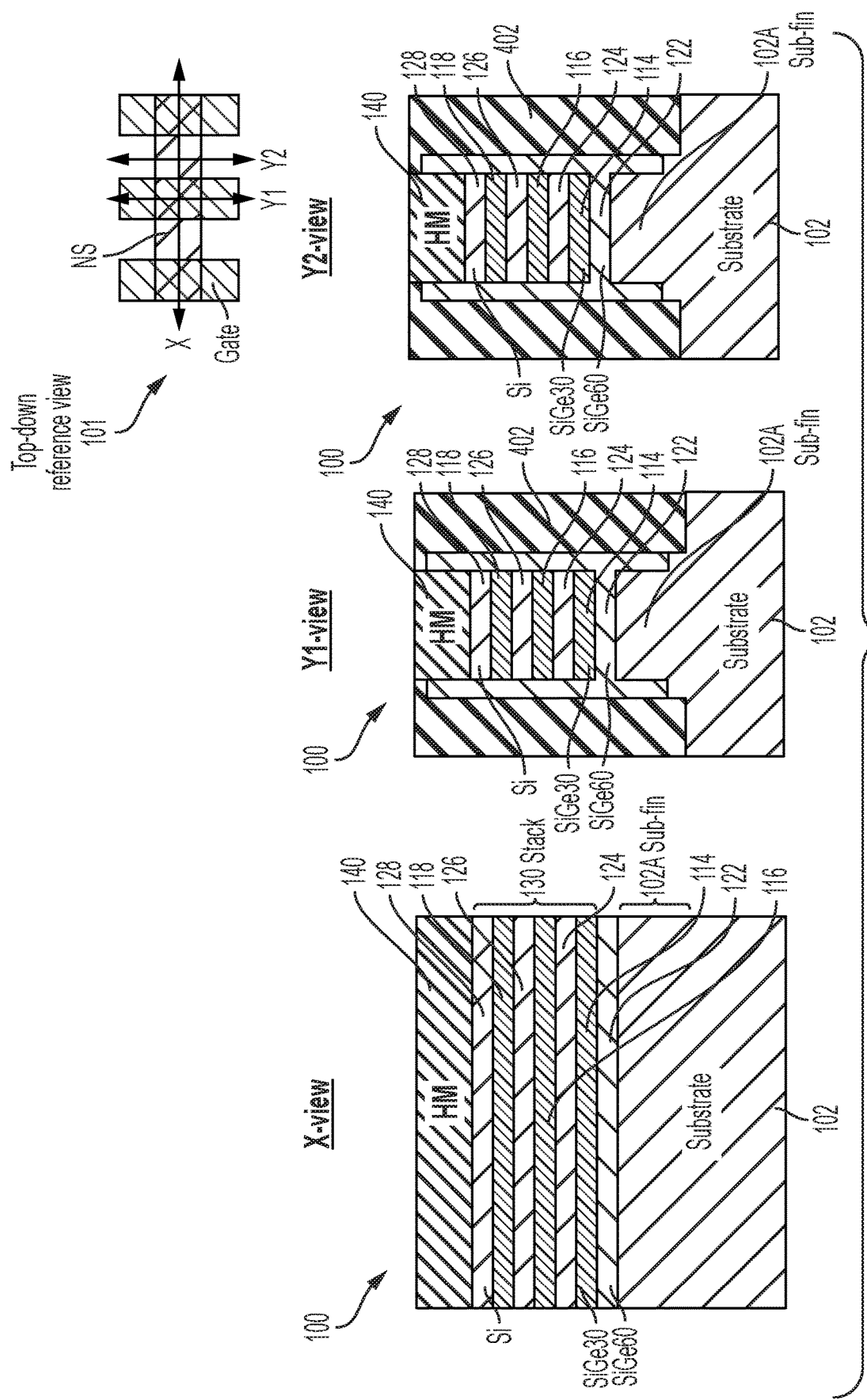

In FIG. 4, known fabrication operations have been used to deposit then planarize a fill material 402. In embodiment of the invention, the fill material 402 is an oxide such as $SiO_2$.

Figure 5:
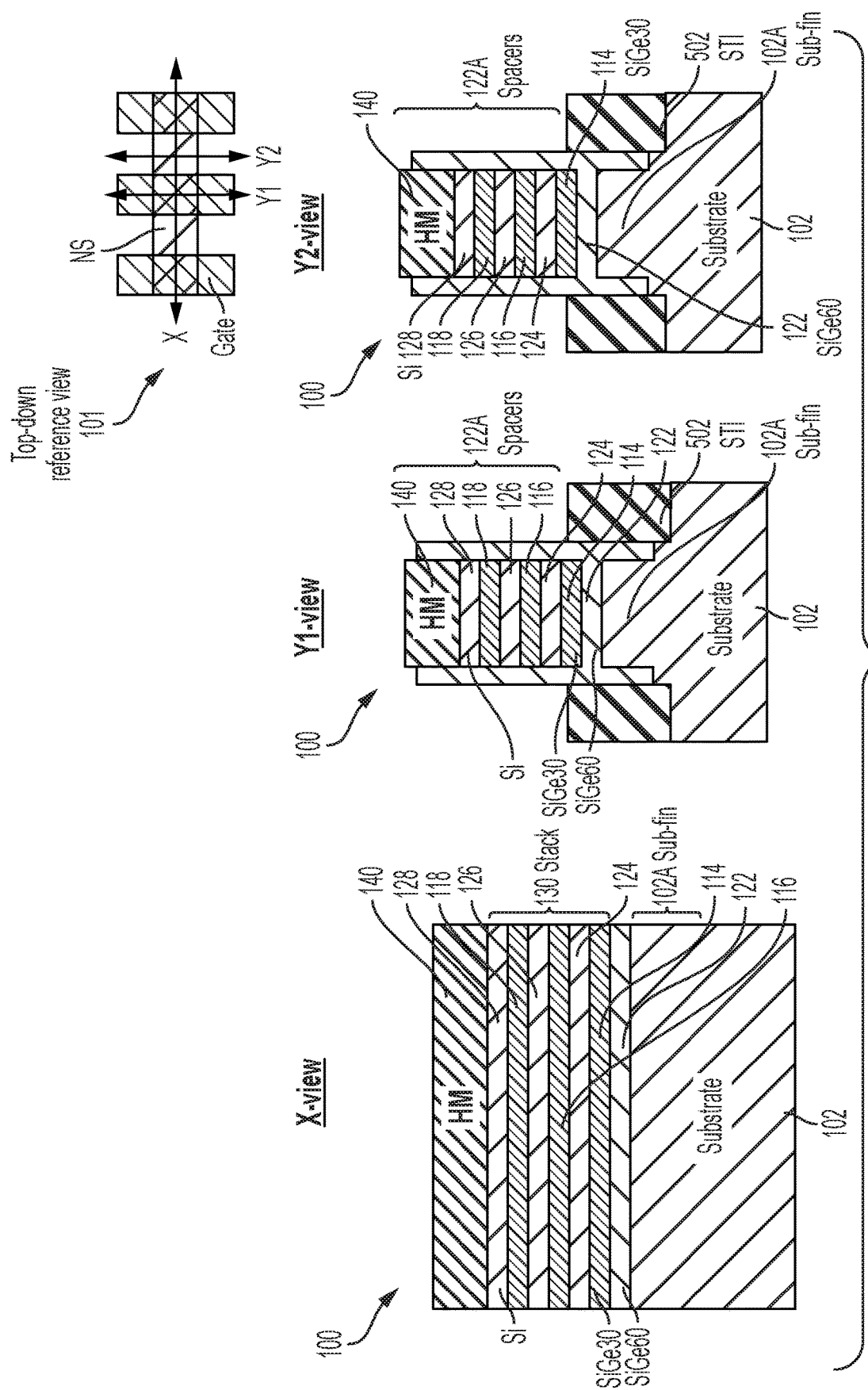

In FIG. 5, known fabrication operations have been used to recess the fill material 402, thereby forming STI regions 502 and exposing the spacers 122A of the H-shaped BDI sacrificial region 122. The presence of the spacers 122A allows the H-shaped BDI sacrificial region 122 to be opened and accessed without having to recess the fill material 402 to the level that is below the sacrificial nanosheet 114. This allows for the formation of taller STI regions 502 that can extend above the bottom of the nanosheet stack 130 and land anywhere along the sidewalls of the nanosheet stack 130. Having taller STI regions 502 that extend above the bottom of the nanosheet stack 130 and land anywhere along the sidewalls of the nanosheet stack 130, particularly in regions of the nanosheet stack 130 where the S/D regions 1002 (shown in FIG. 10) will be formed, mitigates the impact of unintended STI recess, as well as high parasitic capacitance between the HKMG 1302 (shown in FIG. 13) and the substrate 102.

Figure 6:
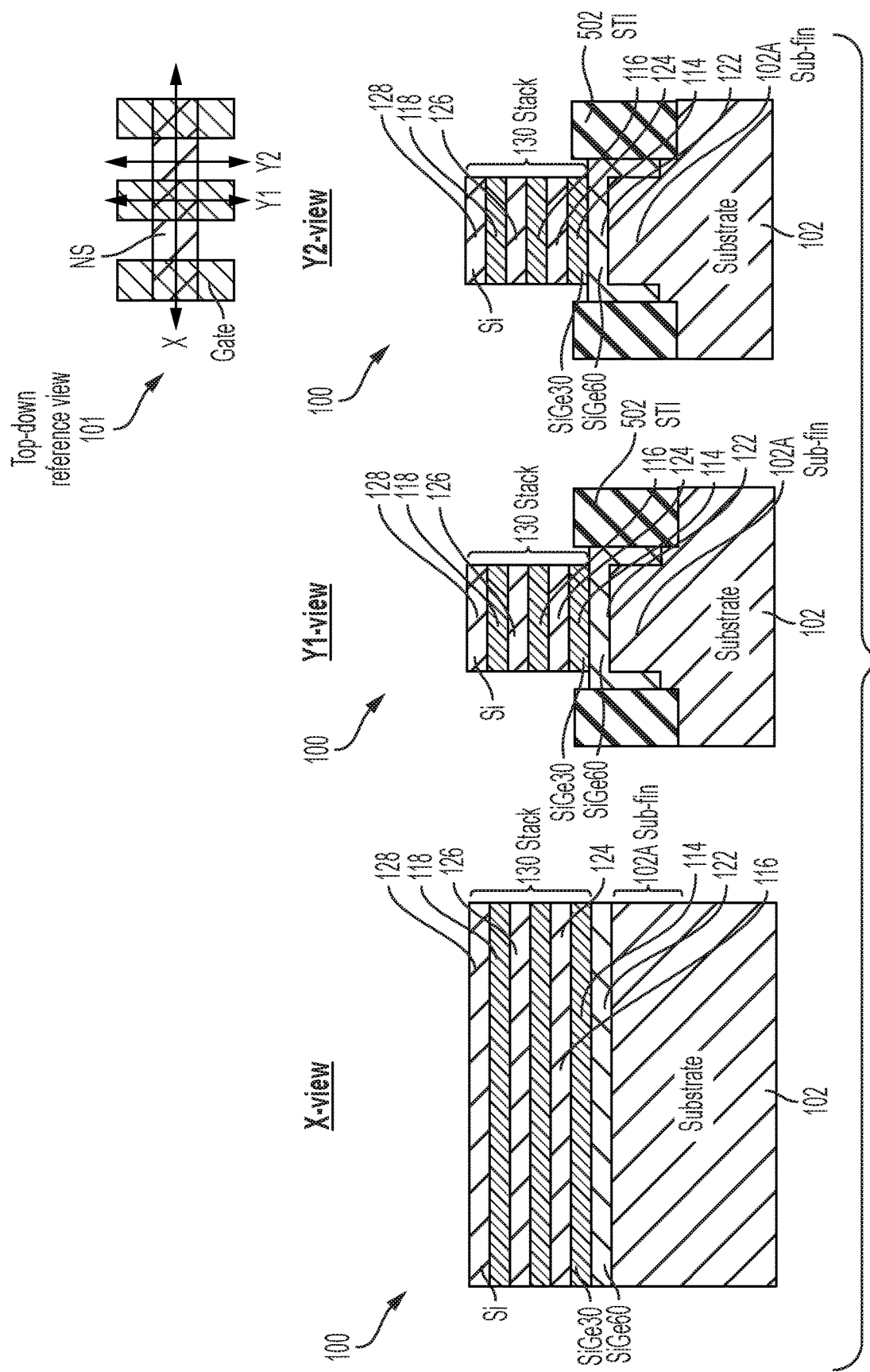

In FIG. 6, known fabrication operations have been used to remove the hard mask 140 and remove the spacers 122A (shown in FIG. 5) of the BDI sacrificial region 122, thereby exposing portions of a top surface of the BDI sacrificial region 122 on both sides of the nanosheet stack 130.

Figure 7:
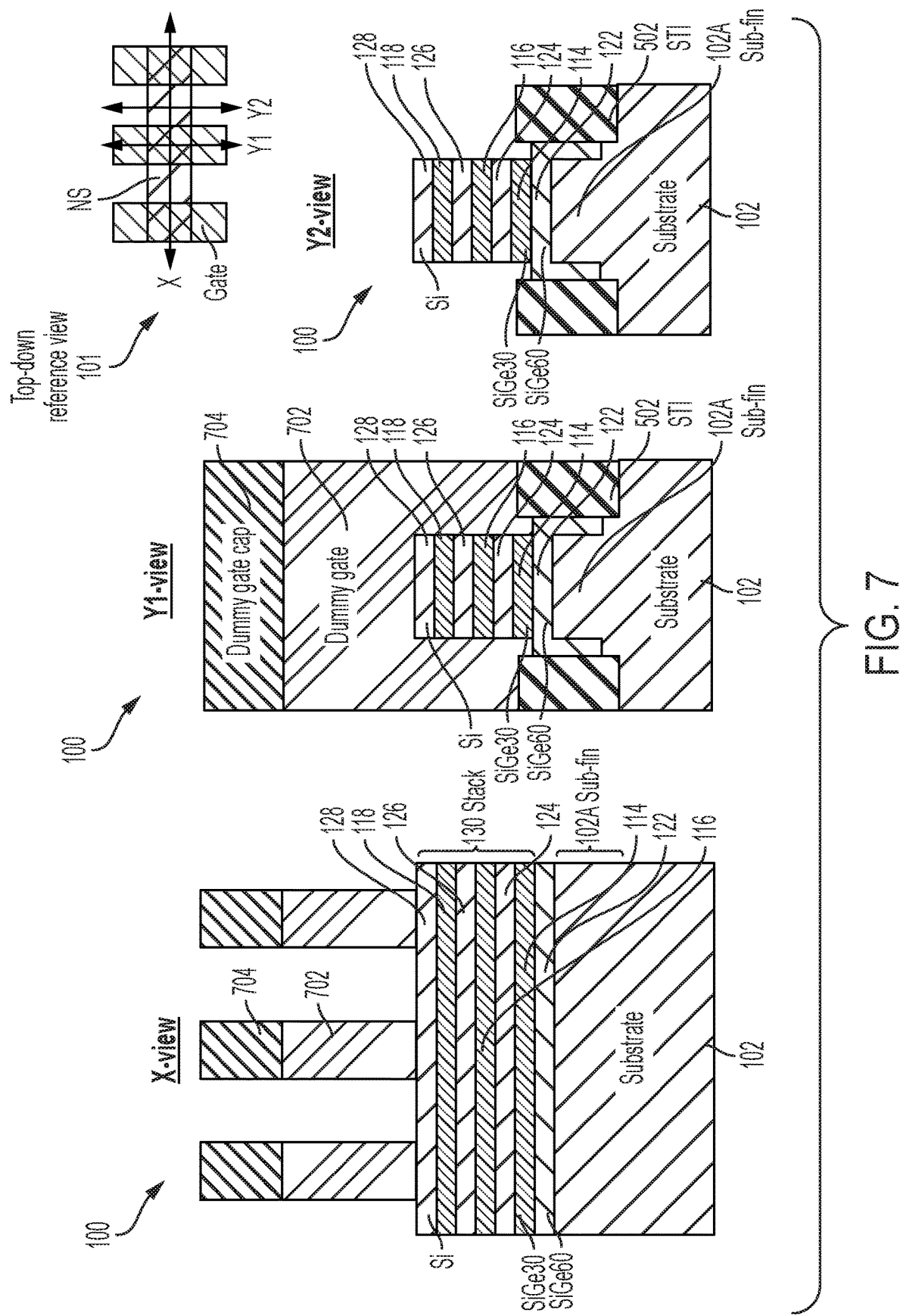

In FIG. 7, known fabrication operations have been used to form dummy gates 702. The dummy gates 702 can be formed from amorphous silicon (a-Si) by depositing a thin layer of gate oxide (not shown separately from the dummy gates 702) over the nanosheet stack 130 then depositing a layer of a-Si (not shown) over the gate oxide. The a-Si is planarized (e.g., by CMP) to a desired level. A patterned hard mask (e.g., a nitride) (not shown) is deposited over the planarized a-Si. The pattern of the hard mask defines the footprints of the dummy gates 702 and the gate oxide. An etch (e.g., an RIE) or a recess is applied to remove the portions of the a-Si layer and the gate oxide that are not covered by the patterned hard mask to form the dummy gate caps 704 (formed from the patterned hard mask material) and the dummy gates 702 over the nanosheet stack 130. A post-gate DHF cleaning is performed to ensure that all of the gate oxide that is not under the dummy gates 702 has been removed, particularly from the exposed portions of the top surfaces of the BDI sacrificial region 122 on both sides of the nanosheet stack 130 (best shown in the Y2-view). As best shown in the Y1-view, a portion of each dummy gate 702 lands on the exposed portions of top surfaces of the BDI sacrificial region 122 on both sides of the nanosheet stack 130.

Figure 8:
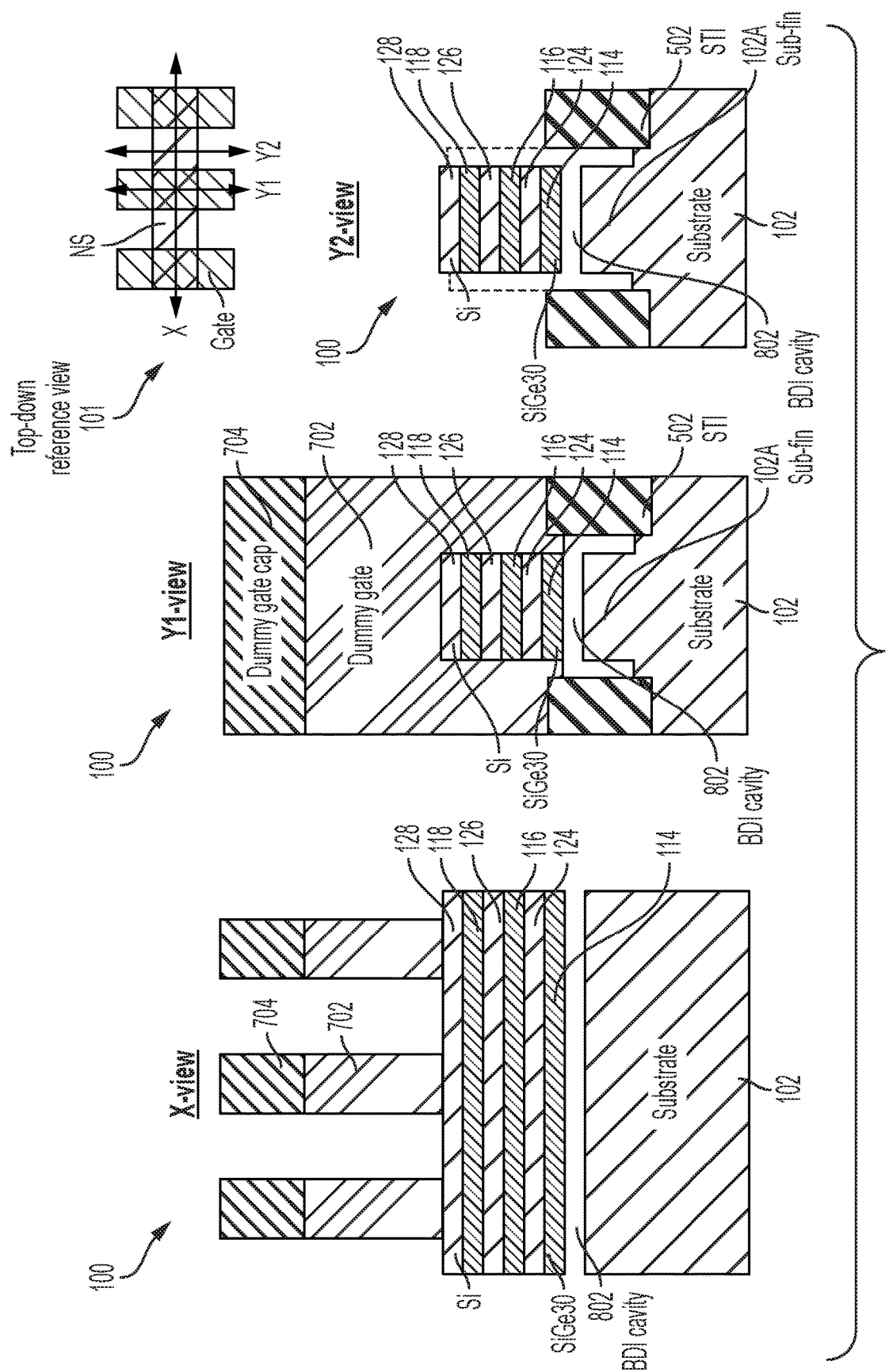

In FIG. 8, known fabrication operations have been used to remove the BDI sacrificial region 122, thereby forming BDI cavities 802, which are defined by the spaces that were occupied by the removed regions of the BDI sacrificial regions 122. In aspects of the invention, the BDI sacrificial region 122 is formed from a material (e.g., SiGe 60%, $TiO_X$, and the like) that can be selectively removed without also removing (or etching) the other elements of the nanosheet-based structure 100.

In FIG. 9, known semiconductor fabrication operations (e.g., ALD) are used to form offset gate spacers 910 on sidewalls of the dummy gates 702, and to also form a wrap-around BDI structure 902 in accordance with aspects of the invention. In embodiments of the invention, the wrap-around BDI structure 902 is configured in an inverted U-shape having an elongated BDI central region 902A, and high aspect-ratio BDI "legs" 902B that extend from each end of the BDI central region 902A. The wrap-around BDI structure 902 wraps around the sub-fin 102A of the substrate 102. The leftmost and rightmost BDI legs 902B separate the STI regions 502 from the sub-fn 201A, and at least a part of the dummy gates 702 that are outside the nanosheet stack 130 lands above the BDI legs 902B. As previously noted herein, inevitable fabrication process variations will result in STI regions being unintentionally recessed so that the STI region is lower than whatever BDI structure is provided in the transistor device. In accordance with aspects of the invention, the wrap-around BDI structure 902 ensures that, regardless of the level of unintended STI height variations, the HKMG stack 1302 does not contact the sub-fin 102A of the substrate 102, thereby minimizing parasitic capacitance and substantially eliminating the impact of the height level of the STI 502 on parasitic capacitance. In embodiments of the invention, the height of the BDI legs 902B can extend to the bottom of the STI region 505, which greatly enlarges the process window for the STI regions 502 and better accommodates the unintentional but inevitable STI recess that occurs during the downstream device processing operations.

Referring still to FIG. 9, in embodiments of the invention, the offset gate spacers 910 and the wrap-around BDI structure 902 are formed by a conformal deposition of a dielectric material (e.g., an oxide and/or a nitride) over all exposed surfaces of the structure 100 followed by a directional etch (e.g., RIE) to form the gate spacers 910 and portions of the BDI legs 902B (best shown in the Y2-view). In some embodiments of the invention, the offset gate spacers 910 can include silicon oxide, silicon nitride, silicon oxynitride, SiBCN, SiOCN, SiOC, or any suitable combination of those materials.

In FIG. 10, the portions of the nanosheet stack 130 that are not covered by the offset gate spacers 910 and the dummy gates 702 are etched, thereby forming multiple instance of the nanosheet stack 130 having formed thereon the dummy gates 702 and the gate spacers 910. Removing portions of the nanosheet stacks 130 forms trenches (not shown) in which the S/D regions 1002, 1004 will be formed, and also provides access to end regions of the sacrificial nanosheets 114, 116, 118. Prior to forming the S/D regions 1002, 1004, known semiconductor fabrication processes have been used to partially remove end regions of the sacrificial nanosheet regions 114, 116, 118 to form end region cavities (not shown). In embodiments of the invention, the end regions of the sacrificial nanosheets 114, 116, 118 can be removed using a so-called "pull-back" process to pull the SiGe 30% sacrificial nanosheet regions 114, 116, 118 back an initial pull-back distance such that the ends of the sacrificial nanosheets 114, 116, 118 now terminate at about the inner edge of the gate spacers 910. In embodiments of the invention, the pull-back process leverages the fact that the sacrificial nano sheets 114, 116, 118 are formed from SiGe 30%, which can be selectively etched with respect to the Si channel nanosheets 124, 126, 128 using, for example, a vapor phase hydrogen chloride (HCL) gas isotropic etch process.

Referring still to FIG. 10, known semiconductor device fabrication processes have been used to form inner spacers 920 in the cavities (not shown) formed in the end regions of the sacrificial nanosheets 114, 116, 118. In embodiments of the invention, the inner spacers 920 can be formed using, e.g., a conformal deposition process to deposit a dielectric over the end region cavities such that dielectric pinches off in the end region cavities to form the inner spacers 902. A subsequent isotropic or anisotropic etch back is performed to remove excess dielectric material on exposed vertical and horizontal surfaces of the structure 100. The inner spacers 920 can be silicon nitride, silicoboron carbonitride, silicon carbonitride, silicon carbon oxynitride, or any other type of dielectric material (e.g., a dielectric material having a dielectric constant k of less than about 5).

Referring still to FIG. 10, known fabrication operations have been used to form a doped S/D region 1002 and a doped S/D region 1004 on the end regions of the channel nanosheets 124, 126, 128, thereby creating initial p/n junctions at the interfaces between the channel nanosheets 124, 126, 128 and the S/D regions 1002, 1004. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

The doped S/D regions 1002, 1004 can be formed by a variety of methods, such as, for example, in-situ doped epitaxy, doping following the epitaxy, implantation and plasma doping, ultrahigh vacuum chemical vapor deposition (UHVCVD), rapid thermal chemical vapor deposition (RTCVD), metal organic chemical vapor deposition (MOCVD), low-pressure chemical vapor deposition (LPCVD), limited reaction processing CVD (LRPCVD), and MBE. In some embodiments of the invention, the doped S/D regions 1002, 1004 can be doped during deposition (in-situ doped) by adding dopants such as n-type dopants (e.g., phosphorus or arsenic) or p-type dopants (e.g., Ga, B, $BF_2$, or Al). To reduce S/D contact resistance, the doped S/D regions 1002, 1004 can be highly doped and can be formed from $Si_{1-x}Ge_x$ having a higher Ge % (e.g., Ge %≥about 50%). In embodiments of the invention, the Ge % in the $Si_{1-x}Ge_x$ embodiments of the S/D regions 1002, 1004 can be selected to maximize the dopant solubility in the $Si_{1-x}Ge_x$ S/D regions 1002, 1004. For example, it is generally accepted that a Ge % that can maximize the B solubility in $Si_{1-x}Ge_x$ embodiments of the S/D regions 1002, 1004 is a Ge %≥about 65%.

Figure 11:
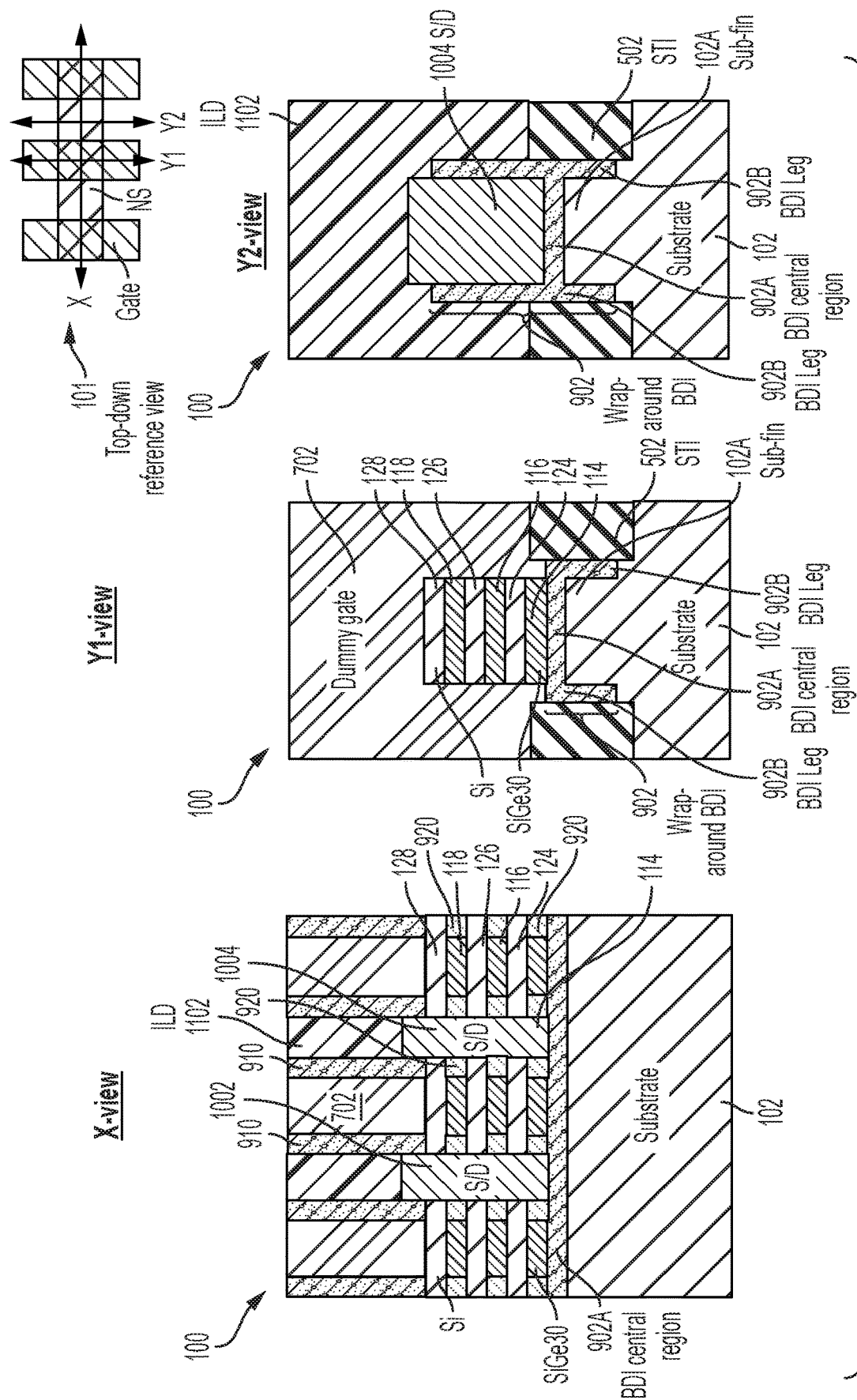

In FIG. 11, known fabrication operations have been used to deposit then planarize a fill material 1102. In embodiment of the invention, the fill material 1102 is an interlayer dielectric (ILD), which can be a nitride or an oxide material.

Figure 12:
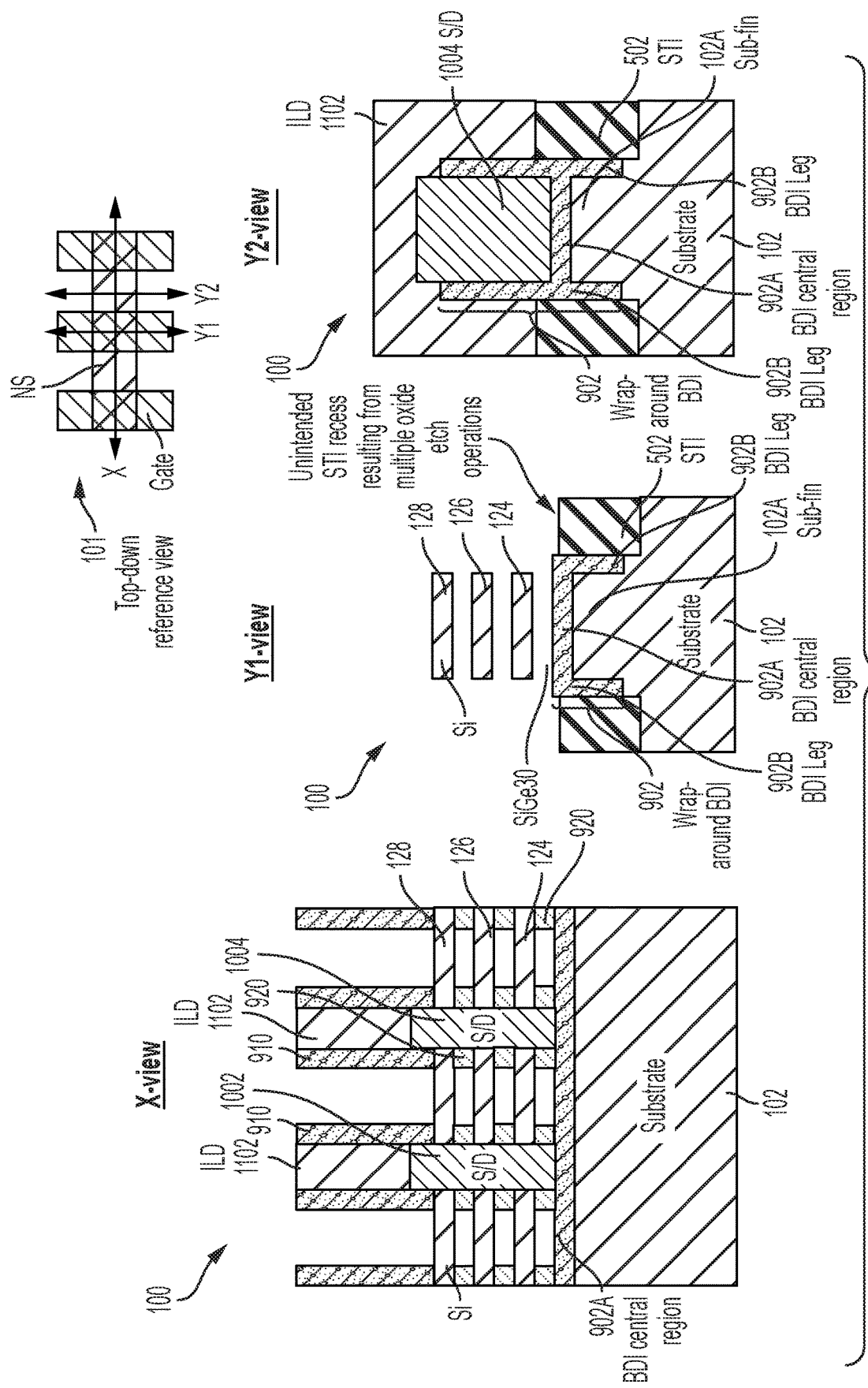

In FIG. 12, the dummy gates 702 and its gate dielectric have been removed. The dummy gate 702 and the gate dielectric can be removed by a known etching process, e.g., RIE or wet removal process. Known semiconductor fabrication operations have also been used to remove the SiGe 30% sacrificial nanosheets 114, 116, 118. In embodiments of the invention, the sacrificial nanosheets 114, 116, 118 are formed from SiGe 30%, which can be selectively etched with respect to the Si channel nanosheets 124, 126, 128 using, for example, a vapor phase hydrogen chloride (HCL) gas isotropic etch process. As depicted in the Y1-view, the STI regions 502 have been unintentionally recessed from a variety of fabrication process variations, including for example, the various dielectric etch operations since the intentional recess of the STI region 502 by the fabrication operations shown in FIG. 5.

Figure 13:
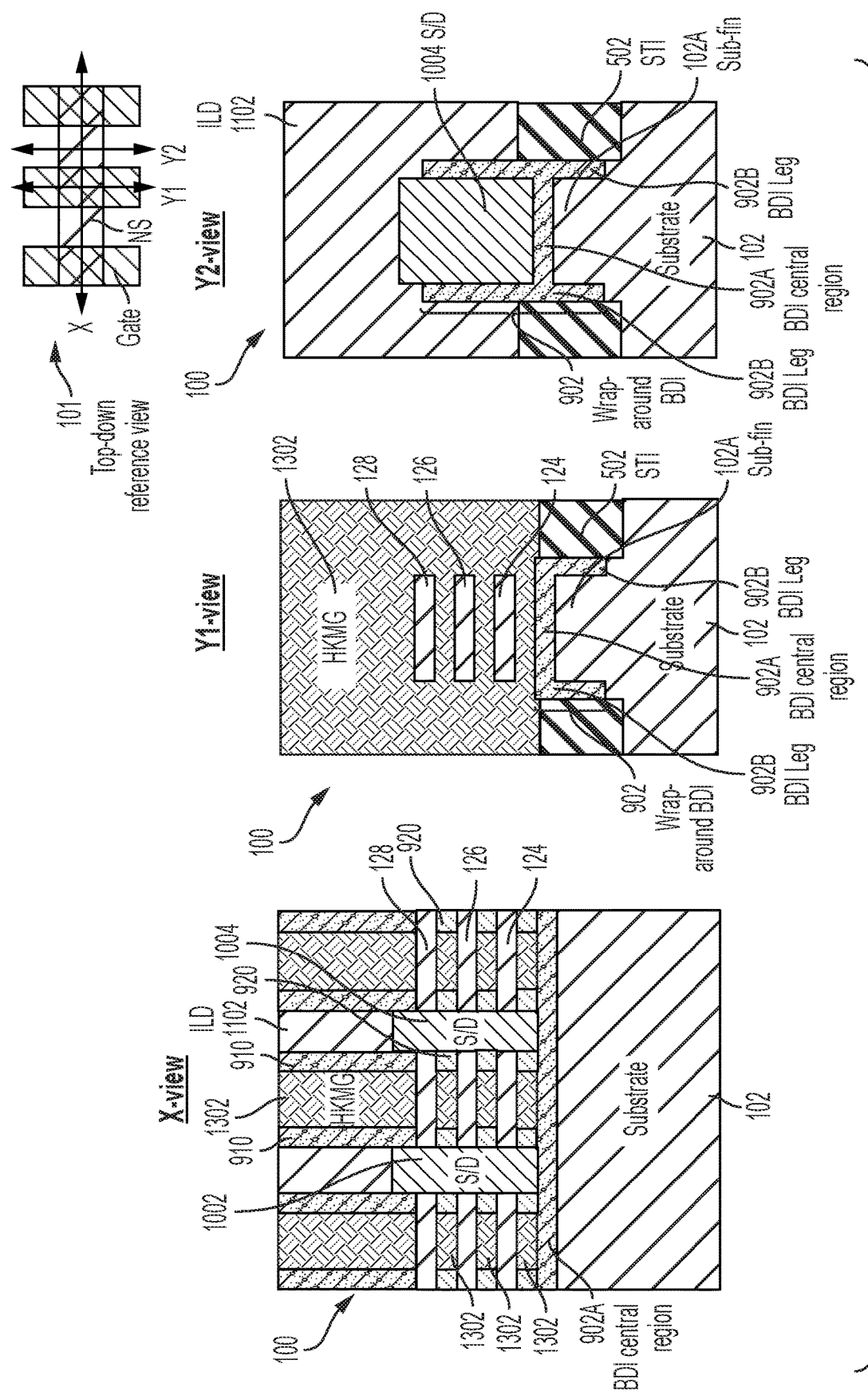

In FIG. 13, known fabrication operations have been used to replace the removed sacrificial nanosheet layers 114, 116, 118 and the removed dummy gates 702 with a high-k metal gate (HKMG) structure having a dielectric layer (not shown separately) and a metal gate structure (not shown separately). The metal gate structure can include metal liners and work-function metals (WFM). In embodiments of the invention, the WFM can be, for example, TiN or TaN, and the metal gate structure can be aluminum or tungsten. The dielectric layer can include interfacial layers (IL) and high-k dielectric layers. In some embodiments of the invention, the high-k dielectric layers can modify the work function of the WFM. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

Referring still to FIG. 13, the HKMG 1302 surrounds the stacked nanosheet channels 124, 126, 128 and regulates electron flow through the nanosheet channels 124, 126, 128 between the S/D region 1002 and the S/D region 1004.

Figure 14:
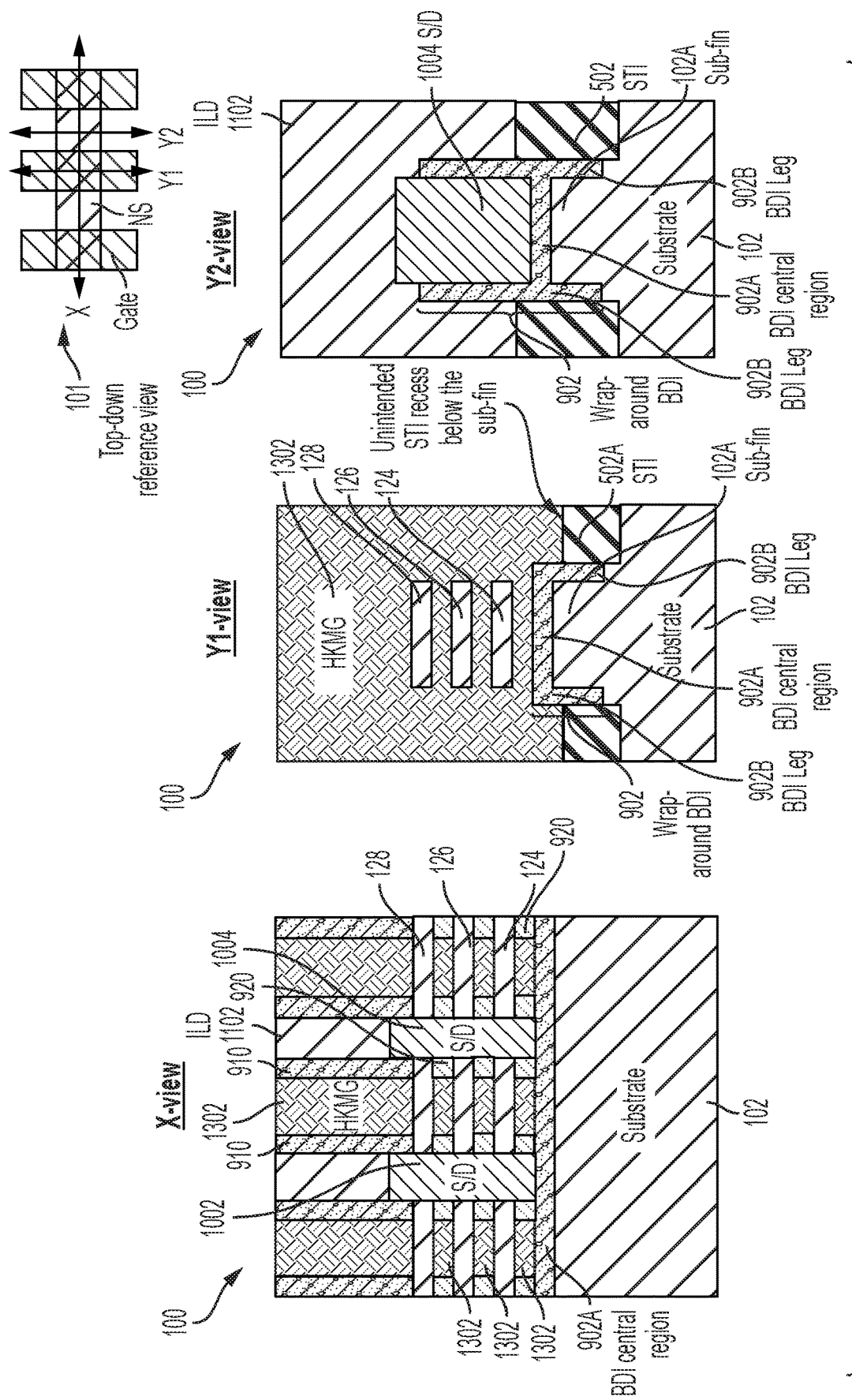

FIG. 14 is identical to FIG. 13 but shows an example in which, as depicted in the Y1-view, the STI regions 502 have been unintentionally recessed to a level that is below the BDI central region 902A. If not for the presence of the BDI legs 902B, the HKMG 1302 would be present underneath the BDI central region 902A and contact the sub-fin 102A of the substrate 102.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of performing fabrication operations to form a nanosheet field effect transistor (FET) device, wherein the fabrication operations include:
    forming a sacrificial structure over a substrate, wherein the sacrificial structure comprises a central region, a first leg at a first end of the central region, and a second leg at a second end of the central region;
    forming a nanosheet stack over the central region;
    forming shallow trench isolation (STI) regions over portions of the substrate;
    wherein the substrate comprises a sub-fin region;
    removing the sacrificial structure; and
    depositing an isolation material within a space that was occupied by the sacrificial structure to form a wrap-around bottom dielectric isolation (BDI) structure having a BDI central region, a first BDI leg at a first end of the BDI central region, and a second BDI leg at a second end of the BDI central region;
    wherein the sub-fin region is positioned under the BDI central region; and
    wherein a top surface of a first one of the STI regions is below a top surface of the sub-fin.

2. The method of claim 1, wherein the first BDI leg is positioned between the sub-fin and the first one of the STI regions.

3. The method of claim 2, wherein the second BDI leg is positioned between the sub-fin and a second one of the STI regions.

4. The method of claim 3, wherein a top surface of the second one of the STI regions is below the top surface of the sub-fin.

5. The method of claim 4, wherein:
    the top surface of the first one of the STI regions is at a first level when the first one of the STI regions is formed; and
    the fabrication operations unintentionally recess the top surface of the first one of the STI regions to a second level;
    wherein the second level is below the top surface of the sub-fin.

6. The method of claim 5, wherein:
    the top surface of the second one of the STI regions is at a third level when the second one of the STI regions is formed; and
    the fabrication operations unintentionally recess the top surface of the second one of the STI regions to a fourth level;
    wherein the fourth level is below the top surface of the sub-fin.

7. A method of performing fabrication operations to form a nanosheet field effect transistor (FET) device, wherein the fabrication operations include:
    forming a sub-fin of a substrate;
    forming a sacrificial structure over the sub-fin of a substrate, wherein the sacrificial structure comprises a central region, a first leg at a first end of the central region, and a second leg at a second end of the central region;
    forming a nanosheet stack over the central region;
    wherein a first portion of the first leg is on a first sidewall of the nanosheet stack;
    wherein a second portion of the first leg is on a first sidewall of the sub-fin;
    wherein a first portion of the second leg is on a second sidewall of the nanosheet stack;
    wherein a second portion of the second leg is on a second sidewall of the sub-fin;
    depositing a dielectric layer over the substrate and adjacent the first leg and the second leg;
    recessing the dielectric layer to form STI regions and expose the first portion of the first leg and the second portion of the second leg;
    removing the first portion of the first leg and the second portion of the second leg;

removing the sacrificial structure; and depositing an isolation material within a space that was occupied by the sacrificial structure to form a wrap-around bottom dielectric isolation (BDI) structure having a BDI central region, a first BDI leg at a first end of the BDI central region, and a second BDI leg at a second end of the BDI central region.

8. The method of claim 7, wherein the first BDI leg is positioned between the sub-fin and a first one of the STI regions.

9. The method of claim 8, wherein the second BDI leg is positioned between the sub-fin and a second one of the STI regions.

10. The method of claim 9, wherein a top surface of the first one of the STI regions is below a top surface of the sub-fin.

11. The method of claim 10, wherein a top surface of the second one of the STI regions is below the top surface of the sub-fin.

12. The method of claim 11, wherein:

the top surface of the first one of the STI regions is at a first level when the first one of the STI regions is formed; and the fabrication operations unintentionally recess the top surface of the first one of the STI regions to a second level;

wherein the second level is below the top surface of the sub-fin.

13. The method of claim 11, wherein: the top surface of the second one of the STI regions is at a third level when the second one of the STI regions is formed; and the fabrication operations unintentionally recess the top surface of the second one of the STI regions to a fourth level; wherein the fourth level is below the top surface of the sub-fin.

* * * * *